United States Patent
Pradelles et al.

(10) Patent No.: US 10,737,641 B2
(45) Date of Patent: Aug. 11, 2020

(54) MOTOR VEHICLE ENGINE CONTROL ELECTRONIC COMPUTER

(71) Applicants: CONTINENTAL AUTOMOTIVE FRANCE, Toulouse (FR); CONTINENTAL AUTOMOTIVE GmbH, Hannover (DE)

(72) Inventors: Christian Pradelles, Eaunes (FR); Sebastien Sanchez, Colomiers (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 492 days.

(21) Appl. No.: 15/434,911

(22) Filed: Feb. 16, 2017

(65) Prior Publication Data
US 2017/0240124 A1 Aug. 24, 2017

(30) Foreign Application Priority Data
Feb. 22, 2016 (FR) ...................................... 16 51419

(51) Int. Cl.
*B60L 1/00* (2006.01)
*B60L 3/00* (2019.01)
(Continued)

(52) U.S. Cl.
CPC .............. *B60R 16/02* (2013.01); *G06F 1/181* (2013.01); *H03K 17/74* (2013.01); *H03K 19/017581* (2013.01); *H05K 5/0017* (2013.01)

(58) Field of Classification Search
CPC ......... B60R 16/02; G06F 1/181; H03K 17/74; H03K 19/017581; H05K 5/0017
(Continued)

(56) References Cited

U.S. PATENT DOCUMENTS

| 6,573,753 | B1 | 6/2003 | Snyder |
| 7,592,713 | B2 * | 9/2009 | Bryan ................. B60R 16/0315 307/9.1 |

(Continued)

FOREIGN PATENT DOCUMENTS

| CN | 101239590 A | 8/2008 |
| CN | 203381507 U | 1/2014 |

(Continued)

OTHER PUBLICATIONS

FR Search Report, dated Oct. 20, 2016, from corresponding FR application.

*Primary Examiner* — Rexford N Barnie
*Assistant Examiner* — Toan T Vu
(74) *Attorney, Agent, or Firm* — Young & Thompson

(57) ABSTRACT

The subject matter of the present invention is a motor vehicle engine control electronic computer including an electric circuit (1B) for managing at least one piece of electrical equipment (2) of the vehicle. The electric circuit includes at least one module (20B) for digital connection to a piece of electrical equipment of the vehicle and a microcontroller (10) including at least one digital input port (110). The digital connection module includes a connector (210) for linking to the electrical equipment, a link (220) for connecting to the digital input port of the microcontroller and a diode package (230B1), connected firstly to the battery (B) voltage of the vehicle and secondly to the ground (M), including two diodes (231B-1, 231B-2) linked to each other at a midpoint (232) and being configurable to operate with a common anode or with a common cathode.

12 Claims, 2 Drawing Sheets

(51) Int. Cl.
  *H02G 3/00* (2006.01)
  *B60R 16/02* (2006.01)
  *H03K 19/0175* (2006.01)
  *H03K 17/74* (2006.01)
  *G06F 1/18* (2006.01)
  *H05K 5/00* (2006.01)

(58) Field of Classification Search
  USPC .................. 307/9.1, 10.1; 320/112; 363/147
  See application file for complete search history.

(56) References Cited

U.S. PATENT DOCUMENTS

| | | | |
|---|---|---|---|
| 2002/0050841 A1* | 5/2002 | Murr | H02J 13/0003 327/20 |
| 2005/0236900 A1 | 10/2005 | Kahara et al. | |
| 2011/0304847 A1 | 12/2011 | Mahowald | |
| 2014/0265592 A1 | 9/2014 | Clarke et al. | |
| 2015/0175099 A1 | 6/2015 | Puzenat | |
| 2016/0156223 A1 | 6/2016 | Clarke et al. | |
| 2017/0067952 A1 | 3/2017 | Clarke et al. | |

FOREIGN PATENT DOCUMENTS

| | | |
|---|---|---|
| CN | 104520129 A | 4/2015 |
| CN | 104823034 A | 8/2015 |

\* cited by examiner

Prior Art

US 10,737,641 B2

MOTOR VEHICLE ENGINE CONTROL ELECTRONIC COMPUTER

FIELD OF THE INVENTION

The present invention relates to the automotive field and more particularly to a motor vehicle electronic computer, the digital inputs of which can be easily configured so as to be linked to various types of electric connections.

BACKGROUND OF THE INVENTION

In a known manner, a motor vehicle comprises a plurality of electronic computers each for monitoring or controlling pieces of vehicle equipment.

Thus, a vehicle comprises, for example, an engine control computer in order to control the operating parameters of the engine (such as, for example, the injection of the fuel into the engine cylinders), a computer for commanding the system for regulating the speed of the vehicle, etc.

Conventionally, an electronic computer is in the form of a box in which a printed circuit is mounted, to which are connected the pieces of equipment at the input of the circuit if they provide information to the electronic computer or at the output of the circuit if they are commanded by the electronic computer.

Such a printed circuit comprises, in a known manner, a microcontroller and a plurality of digital connection modules for connecting each piece of equipment to the microcontroller, each digital connection module being connected to a digital input port of the microcontroller.

Depending on the nature and the operation of the pieces of equipment which are connected to the computer, some of the connection modules should allow a digital input for connection to the supply battery of the vehicle (in this case, the digital connection module is said to be in a "pull up" configuration) and others should allow a digital input for connection to the ground (in this case, the digital connection module is said to be in a "pull down" configuration).

To reduce the costs, an electronic computer is designed such as to be usable in various motor vehicles or with various configurations for connecting to pieces of equipment. Yet, depending on the vehicle or the connecting configuration, the type of configuration of each connection module ("pull up" or "pull down") can vary.

To solve this problem, a known solution consists in making each digital connection module configurable in the "pull up" or "pull down" mode, for example via the manufacturer of the vehicle during the factory construction.

One existing solution for a printed circuit 1A is described with reference to FIGS. 1 and 2. For the purpose of clarity, a single digital input port 110 of the microcontroller 10 and a single digital connection module 20A linked to the digital input port 110 have been shown.

The digital connection module 20A firstly comprises a connector 210 for linking to a piece of equipment 2 of the vehicle and a connecting link 220 for linking the digital connection module 20A to the associated digital input port 110.

To process the signals flowing between the equipment 2 and the microcontroller 10, the digital connection module 20A comprises:

an input capacitor Ce connected firstly to the linking connector 210 and secondly to the ground M,
a first output resistor Rs1 connected firstly to the linking connector 210 and secondly to the digital input port 110 of the microcontroller 10 via the connection link 220,
a second output resistor Rs2 connected firstly to the digital input port 110 of the microcontroller 10 via the connecting link 220 and secondly to the ground M,
an output capacitor Cs connected firstly to the digital input port 110 of the microcontroller 10 via the connecting link 220 and secondly to the ground M.

To configure the type of the digital connection module 20A, a diode package 230A is mounted on the printed circuit 1A between the input capacitor Ce and the first output resistor Rs1. This diode package 230A comprises two diodes 231A-1, 231A-2, linked to one another at a midpoint 232, and orientated identically in order to conduct the current between a high point 233 and the midpoint 232 or between the midpoint 232 and a low point 234, the midpoint 232 of the diode package 230A being connected to the linking connector 210.

To allow the configuration of the digital connection module 20A type, two locations P1, P2 are provided to receive an input resistor Re.

To this end, routing electric tracks are provided for each of the locations P1, P2. The first location P1 is thus linked firstly to the battery B voltage of the vehicle and secondly to the high point 233 of the box 230A whereas the second location P2 is linked firstly to the low point 234 of the box 230A and secondly to the ground M.

The diode package 230A can thus be connected either at the high point 233 to the battery B of the vehicle via the input resistor Re when the latter is mounted on the first location P1 (as illustrated in FIG. 1), or at the low point 234 to the ground M via the input resistor Re when the latter is mounted on the second location P2 (as illustrated in FIG. 2).

Thus, depending on the type of the digital connection module 20A desired by the manufacturer for the equipment 2 to be connected, the input resistor Re is mounted on one of the locations P1, P2 of the printed circuit 1A, for example during the construction of the electronic computer, in order to link the connector 210 of the digital connection module 20A to the battery B of the vehicle or to the ground M, respectively.

However, such a solution has disadvantages. Indeed, the printed circuit A1 of an electronic computer is a circuit containing many electrical components, particularly at the inputs thereof. Therefore, such a solution requiring the provision of two locations P1, P2 is complex as it requires the provision of double the routing of electrical tracks, which further requires a considerable space on the epoxy board on which the circuit is printed and all the more so since the number of digital inputs 110 is high, for example greater than eight as standard.

SUMMARY OF THE INVENTION

Therefore, the aim of the invention is to solve at least some of these disadvantages by proposing a printed circuit in which the type of each digital connection module can be easily modified while minimizing the spatial requirement of such a circuit.

To this end, the subject matter of the invention is a motor vehicle engine control electronic computer, said computer comprising a box in which is mounted an electric circuit for managing at least one piece of electrical equipment of the vehicle, said circuit comprising at least one module for digital connection to a piece of electrical equipment of the vehicle and a microcontroller comprising at least one digital input port, said digital connection module comprising:

a connector for linking to the electrical equipment, a link for connecting to the digital input port of the microcontroller, an input capacitor connected firstly to the linking connector and secondly to the ground, a diode package, connected firstly to the battery voltage of the vehicle and secondly to the ground, comprising two diodes linked to each other at a midpoint and being configurable to operate with a common anode or with a common cathode to allow the microcontroller to detect the connection of the electrical equipment to the battery voltage of the vehicle or to the ground, an input resistor connected firstly to the linking connector and secondly to the midpoint of the diode package, a first output resistor connected firstly to the linking connector and secondly to the digital input port of the microcontroller via the connecting link, a second output resistor connected firstly to the digital input port of the microcontroller via the connecting link and secondly to the ground, an output capacitor connected firstly to the digital input port of the microcontroller via the connecting link and secondly to the ground.

In the computer according to the invention, a single location is sufficient for the input resistor, which requires a single routing unlike the prior art which required two locations and therefore double the routing. The use of a single location for the input resistor of the module advantageously allows for reducing the space required for implementing the digital connection module on the printed circuit, which reduces the complexity and the cost thereof. With the computer according to the invention, the digital connection module can be easily configured in "pull up" mode or "pull down" mode depending on the type of electrical equipment that is intended to be connected thanks to the configurable nature of the diode package. Indeed, given that is no longer necessary to choose the location of the input resistor, the digital connection module can be configured by modifying only the connections of the diode package in order to orientate the diodes in the direction corresponding to the desired mode (common anode or common cathode).

The invention also relates to a motor vehicle engine control electronic computer, said computer comprising a box in which is mounted an electric circuit for managing at least one piece of electrical equipment of the vehicle, said circuit comprising at least one module for digital connection to a piece of electrical equipment of the vehicle and a microcontroller comprising at least one digital input port, said digital connection module comprising:

a connector for linking to the electrical equipment, a link for connecting to the digital input port of the microcontroller, an input capacitor connected firstly to the linking connector and secondly to the ground, a diode package, connected firstly to the battery voltage of the vehicle and secondly to the ground, comprising two diodes linked to each other at a midpoint so as to operate with a common cathode to allow the microcontroller to detect the connection of the electrical equipment to the battery voltage of the vehicle, an input resistor connected firstly to the linking connector and secondly to the midpoint of the diode package, a first output resistor connected firstly to the linking connector and secondly to the digital input port of the microcontroller via the connecting link, a second output resistor connected firstly to the digital input port of the microcontroller via the connecting link and secondly to the ground, an output capacitor connected firstly to the digital input port of the microcontroller via the connecting link and secondly to the ground.

Such an arrangement allows for configuring the digital connection module in "pull up" mode.

The invention further relates to a motor vehicle engine control electronic computer, said computer comprising a box in which is mounted an electric circuit for managing the least one piece of electrical equipment of the vehicle, said circuit comprising at least one module for digital connection to a piece of electrical equipment of the vehicle and a microcontroller comprising at least one digital input port, said digital connection module comprising:

a connector for linking to the electrical equipment, a link for connecting to the digital input port of the microcontroller, an input capacitor connected firstly to the linking connector and secondly to the ground, a diode package, connected firstly to the battery voltage of the vehicle and secondly to the ground, comprising two diodes linked to each other at a midpoint so as to operate with a common anode to allow the microcontroller to detect the connection of the electrical equipment to the ground, an input resistor connected firstly to the linking connector and secondly to the midpoint of the diode package, a first output resistor connected firstly to the linking connector and secondly to the digital input port of the microcontroller via the connecting link, a second output resistor connected firstly to the digital input port of the microcontroller via the connecting link and secondly to the ground, an output capacitor connected firstly to the digital input port of the microcontroller via the connecting link and secondly to the ground.

Such an arrangement allows for configuring the digital connection module in "pull down" mode.

The invention also relates to an electronic computer as described above, wherein the microcontroller comprises a plurality of digital input ports, said computer comprises a plurality of digital connection modules, each digital connection module comprising a link for connecting to a digital input port of the microcontroller. Thus, the electronic computer comprises several digital inputs which can be configured either in "pull up" or in "pull down". Thus, the electric circuit can manage a plurality of electrical equipment each connected to a configurable digital input of the electric circuit.

The invention finally relates to a motor vehicle comprising at least one electronic computer as described above.

BRIEF DESCRIPTION OF THE DRAWINGS

Other features and advantages of the invention will emerge during the following description with reference to the appended figures given as nonlimiting examples and wherein identical references are given to similar objects.

DETAILED DESCRIPTION OF THE INVENTION

The following description describes an electronic computer of a motor vehicle. It will be noted that such a use does not limit the scope of the present invention which can be used for any type of vehicle.

The motor vehicle according to the invention comprises an electronic computer, for example for engine control, also referred to as an ECU (Electronic Control Unit). The motor vehicle can also comprise a plurality of electrical equipment such as, for example, a speed regulator and electrical energy supply means for the electronic computer and supply battery-type pieces of equipment.

Each piece of electrical equipment is linked at the input of the electronic computer, if it provides information to the computer, or at the output, if it is commanded by the electronic computer.

The electronic computer according to the invention comprises a printed circuit linked to a plurality of electrical equipment of the vehicle. Thus, the printed circuit comprises a microcontroller and a plurality of digital connection modules for connecting the plurality of equipment to the microcontroller. The microcontroller comprises a plurality of digital input ports to each of which is connected a digital connection module.

Figure 1:
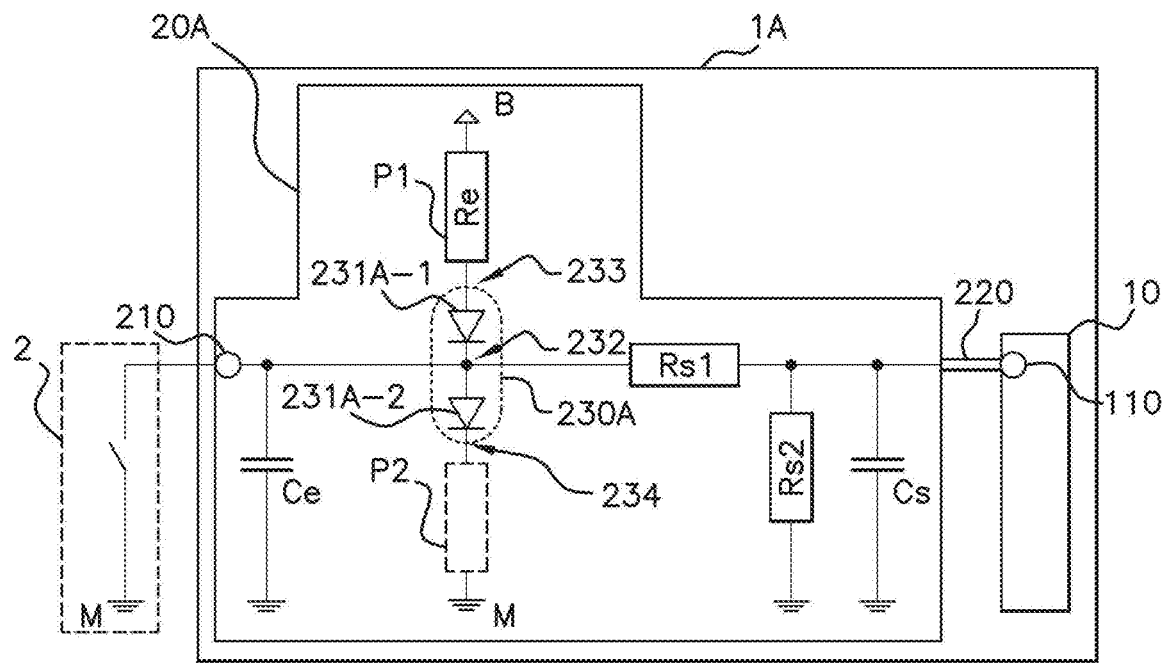
FIGS. 1 and 2 schematically show an embodiment of a computer according to the prior art.
Figure 2:
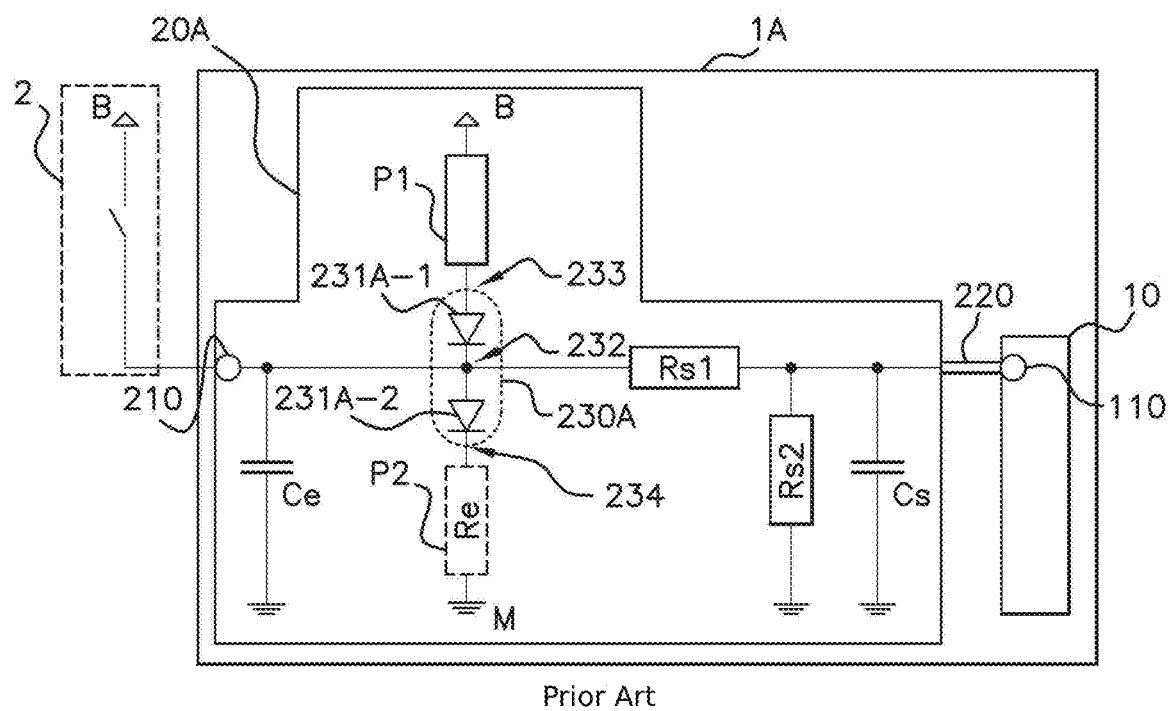
Figure 3:
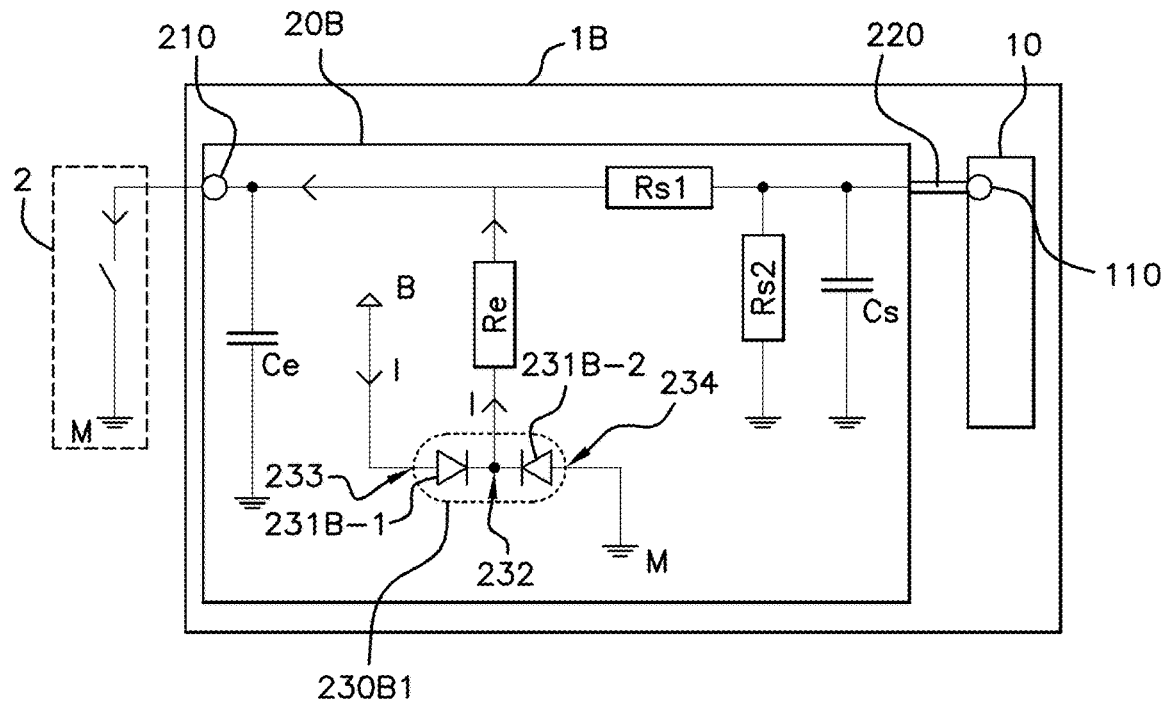
FIGS. 3 and 4 schematically show an embodiment of a computer according to the invention.
Figure 4:
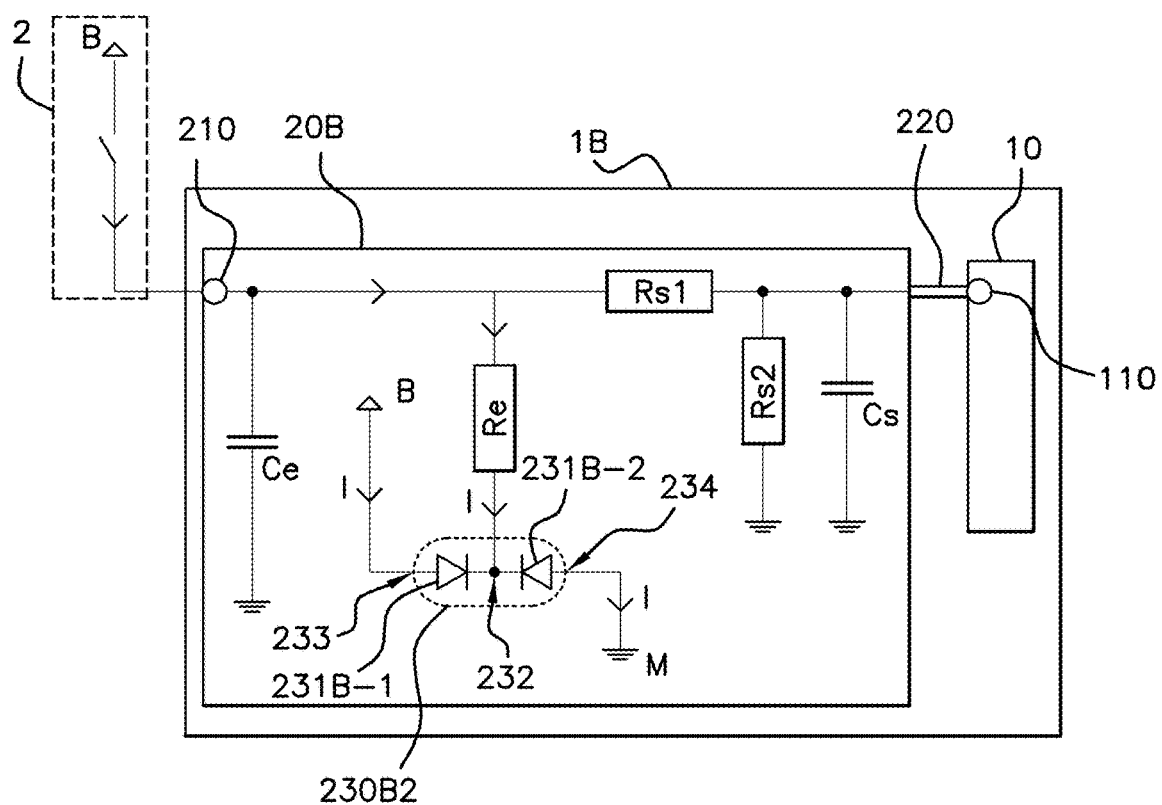

For the purpose of clarity, the printed circuit 1B illustrated in FIGS. 3 and 4 only includes one digital input port 110 of the microcontroller 10 and one digital connection module 20B connected to the digital input port 110. The digital input port 110 allows the microcontroller 10 to receive information from the electrical equipment 2 via the digital connection module 20B in order to process the information.

The digital connection module 20B first comprises a connector 210 for linking to the electrical equipment 2 and a connecting link 220 for linking the digital connection module 20B to the associated digital input port 110.

The information received by the microcontroller 10 relates to the state of the electrical equipment 2, in other words this information allows the microcontroller 10 to determine if the electrical equipment 2 is switched off or switched on.

The state of the electrical equipment 2 corresponds to a voltage received by the digital connection module 20B and transmitted to the digital input port 110 of the microcontroller 10 which determines the state of the electrical equipment 2.

The digital input port 110 can have two states: a low state in which the digital input port 110 receives a zero voltage (connection to the ground M) and a high state in which the digital input port 110 receives a positive voltage corresponding to the voltage delivered by the battery B. In other words, the digital connection module 20B allows for notifying the state of the electrical equipment 2 to the electronic computer, in particular if the equipment is operating ("ON" state) or has stopped ("OFF" state).

Thus, in the case of a speed regulator linked to the digital connection module 20B of the electronic computer, the input signal will be in the high state to signal that the speed regulator is operating, and in the low state to signal that the speed regulator has stopped.

The electronic computer can then command other pieces of electrical equipment 2 such as, for example, the injectors, depending on the state of the regulator in order to regulate the speed of the vehicle.

Therefore, there are two types of digital connection module 20B depending on the manner of connecting the module 20B to the electrical equipment 2: contact to the ground M (FIG. 3) or contact to the battery B (FIG. 4).

In the case of an electrical equipment 2 connection of the ground M contact type, as illustrated in FIG. 3, the digital input port 110 is in the low state when the electrical equipment 2 is connected to the linking connector 210 and in the high state when the electrical equipment 2 is disconnected, the digital connection module 20B being in "pull up" mode.

In the case of an electrical equipment 2 connection of the battery B contact type, as illustrated in FIG. 4, the digital input port 110 is in the high state when the electrical equipment 2 is connected to the linking connector 210 and in the low state when the electrical equipment 2 is disconnected, the digital connection module 20B being in "pull down" mode.

Thus, the microcontroller 10 detects a change in the state of the electrical equipment 2 with respect to the state of the digital input port 110 when the electrical equipment 2 is disconnected.

Still with reference to FIGS. 3 and 4, the digital connection module 20B can be configured in "pull up" mode or "pull down" mode, depending on the type of connection of the electrical equipment 2.

To process the signals between the equipment 2 and the microcontroller 10, the digital connection module 20B comprises a plurality of electronic components.

Thus, firstly, the digital connection module 20B comprises an input capacitor Ce connected firstly to the linking connector 210 and secondly to the ground M. The input capacitor Ce allows the removal of external noise, particularly the electromagnetic interference, also referred to as EMI.

The digital connection module 20B then comprises a first output resistor Rs1 connected firstly to the linking connector 210 and secondly to the digital input port 110 of the microcontroller 10 via the connecting link 220. The first output resistor Rs1 makes it possible to limit the current passing through the digital input port 110.

The digital connection module 20B then comprises a second output resistor Rs2 connected firstly to the digital input port 110 of the microcontroller 10 via the connecting link 220 and secondly to the ground M. The second output resistor Rs2 forms, with the first output resistor Rs1, a voltage divider bridge.

The digital connection module 20B also comprises an output capacitor Cs connected firstly to the digital input port 110 of the microcontroller 10 via the connecting link 220 and secondly to the ground M. The output capacitor Cs makes it possible to filter the signal sent to the microcontroller 10 by the digital input port 110.

The digital connection module 20B further comprises a diode package 230B1, 230B2, connected firstly to the battery B voltage of the vehicle and secondly to the ground M and which is configurable in "pull up" mode or in "pull down" mode.

The diode package 230B1, 230B2 comprises two diodes 231B-1, 231B-2 linked to each other at a midpoint 232. The diode package 230B1, 230B2 thus comprises three linking points: a midpoint 232 located between the two diodes 231B-1, 231B-2, a high point 233 connected to the battery B and a low point 234 connected to the ground M. Thus, a first diode 231B-1 is connected between the high point 233 and the midpoint 232 and a second diode 231B-2 is connected between the low point 234 and the midpoint 232.

Such a diode package 230B1, 230B2 can, for example, be a SOT-23 diode package. The diodes 231B-1, 230B-2 can be signal diodes.

Depending on the connections produced, the diode package 230B1, 230B2 can be configured with a common cathode when the cathodes of the diodes 231B-1, 231B-2 are linked at the midpoint 232 (as illustrated in FIG. 3) or with a common anode when the anodes of the diodes 231B-1, 231B-2 are linked at the midpoint 232 (as illustrated in FIG. 4).

The digital connection module 20B also comprises an input resistor Re connected firstly to the linking connector 210 and secondly to the midpoint 232 of the diode package 230B1, 230B2. The function of the input resistor Re is to circulate an electric current in the electrical equipment 2 in order to determine the state of the connection thereof.

The two diodes 231B-1, 231B-2 are connected in series and in opposite directions in order to only allow a single direction of the electric current I flowing in the package 230B1, 230B2 via the midpoint 232 through only one of the diodes 231B-1, 231B-2 depending on the "pull up" or "pull down" mode configuration of the package.

Thus, depending on the direction of the diodes 231B-1, 231B-2 and therefore the mode of the module 20B, the direction of the electric current I passing through the diode package 230B1, 230B2 is reversed as illustrated in FIGS. 3 and 4.

When the diode package 230B1 is connected with a common cathode ("pull up" mode), as illustrated in FIG. 3, the electric current I generated by the battery B passes through the first diode 231B-1 of the diode package 230B1, then the input resistor Re.

When the diode package 230B2 is connected with a common anode ("pull down"), as illustrated in FIG. 4, the electric current I which passes through the second diode 231B-2 of the diode package 230B2 is directed towards the ground M.

During the assembly of the electronic computer, the diode package 230B1, 230B2 is connected depending on the mode in which the digital connection module 20B must operate as desired by the manufacturer, without it being necessary to choose a location for the input resistor Re which can therefore be soldered on the electric circuit 1B at the same place irrespective of the type of digital connection module 20B. In other words, it is sufficient solely to change the orientation of the diodes 231B-1, 231B-2 in order to adapt the digital connection module 20B to the desired connection of the electrical equipment 2.

A printed circuit 1B of an electronic computer has been shown, which comprises a digital connection module 20B, yet of course it could comprise a plurality thereof in order to connect a plurality of electrical equipment 2 to the electronic computer. In this case, each digital connection module 20B can be configured independently in "pull up" or "pull down" mode in order to be linked to one of the connections of the pieces of electrical equipment 2.

It is added, moreover, that the present invention is not limited to the examples described above and may have numerous alternatives within the capabilities of a person skilled in the art.

The invention claimed is:

1. A motor vehicle engine control electronic computer, comprising:
   a box; and
   an electric circuit, mounted in the box, for managing at least one piece of electrical equipment of a vehicle, said electric circuit including a digital connection module for digitally connecting to a piece of electrical equipment of the vehicle and also including a microcontroller with a digital input port,
   said digital connection module comprised of:
      a linking connector for linking to the electrical equipment;
      a connecting link for connecting to the digital input port of the microcontroller;
      an input capacitor connected firstly to the linking connector and secondly to ground;
      a diode package, connected firstly to a battery voltage of the vehicle and secondly to the ground, the diode package having two diodes linked to each other at a midpoint and being configurable to operate either with a common anode or with a common cathode for the microcontroller to detect a connection of the electrical equipment to the battery voltage of the vehicle or to the ground, respectively;
      an input resistor connected firstly to the linking connector and secondly to the midpoint of the diode package;
      a first output resistor connected firstly to the linking connector and secondly to the digital input port of the microcontroller via the connecting link;
      a second output resistor connected firstly to the digital input port of the microcontroller via the connecting link and secondly to the ground; and
      an output capacitor connected firstly to the digital input port of the microcontroller via the connecting link and secondly to the ground.

2. A motor vehicle engine control electronic computer, comprising:
   a box; and
   an electric circuit, mounted in the box, for managing at least one piece of electrical equipment of a vehicle, said electric circuit including a digital connection module for digitally connecting to a piece of electrical equipment of the vehicle and also including a microcontroller with a digital input port,
   said digital connection module comprised of:
      a linking connector for linking to the electrical equipment;
      a connecting link for connecting to the digital input port of the microcontroller;
      an input capacitor connected firstly to the linking connector and secondly to ground;
      a diode package, connected firstly to a battery voltage of the vehicle and secondly to the ground, the diode package having two diodes linked to each other at a midpoint so as to operate with a common cathode for the microcontroller to detect a connection of the electrical equipment to the battery voltage of the vehicle;
      an input resistor connected firstly to the linking connector and secondly to the midpoint of the diode package;
      a first output resistor connected firstly to the linking connector and secondly to the digital input port of the microcontroller via the connecting link;
      a second output resistor connected firstly to the digital input port of the microcontroller via the connecting link and secondly to the ground; and
      an output capacitor connected firstly to the digital input port of the microcontroller via the connecting link and secondly to the ground.

3. A motor engine control electronic computer, comprising:
   a box; and
   an electric circuit, mounted in the box, for managing at least one piece of electrical equipment of a vehicle, said electric circuit including a digital connection module for digitally connecting to a piece of electrical equipment of the vehicle and also including a microcontroller with a digital input port, said digital connection module comprised of:
- a linking connector for linking to the electrical equipment;
- a connecting link for connecting to the digital input port of the microcontroller;
- an input capacitor connected firstly to the linking connector and secondly to ground;
- a diode package, connected firstly to a battery voltage of the vehicle and secondly to the ground, the diode package having two diodes linked to each other at a midpoint so as to operate with a common anode for the microcontroller to detect a connection of the electrical equipment to the ground;
- an input resistor connected firstly to the linking connector and secondly to the midpoint of the diode package;
- a first output resistor connected firstly to the linking connector and secondly to the digital input port of the microcontroller via the connecting link;
- a second output resistor connected firstly to the digital input port of the microcontroller via the connecting link and secondly to the ground; and
- an output capacitor connected firstly to the digital input port of the microcontroller via the connecting link and secondly to the ground.

4. An electronic computer according to claim 1, wherein the microcontroller comprises a plurality of digital input ports, and said motor vehicle engine control electronic computer comprises a plurality of digital connection modules, each of said digital connection modules having a link for connecting to one of the digital input ports of the microcontroller.

5. A motor vehicle comprising at least one electronic computer according to claim 1.

6. An electronic computer according to claim 2, wherein the microcontroller comprises a plurality of digital input ports, and said motor vehicle engine control electronic computer comprises a plurality of digital connection modules, each of said digital connection modules having a link for connecting to one of the digital input ports of the microcontroller.

7. An electronic computer according to claim 3, wherein the microcontroller comprises a plurality of digital input ports, and said motor vehicle engine control electronic computer comprises a plurality of digital connection modules, each of said digital connection modules having a link for connecting to one of the digital input ports of the microcontroller.

8. A motor vehicle comprising at least one electronic computer according to claim 2.

9. A motor vehicle comprising at least one electronic computer according to claim 3.

10. A motor vehicle comprising at least one electronic computer according to claim 4.

11. A motor vehicle comprising at least one electronic computer according to claim 6.

12. A motor vehicle comprising at least one electronic computer according to claim 7.

* * * * *